(12) United States Patent
Jung

(10) Patent No.: US 6,239,015 B1
(45) Date of Patent: May 29, 2001

(54) SEMICONDUCTOR DEVICE HAVING POLYSILICON INTERCONNECTIONS AND METHOD OF MAKING SAME

(75) Inventor: Hoon Jung, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/204,363

(22) Filed: Dec. 4, 1998

(30) Foreign Application Priority Data

Dec. 4, 1997 (KR) .................................................. 97-65841

(51) Int. Cl.[7] .................................................. H01L 21/4763
(52) U.S. Cl. ............................ 438/618; 438/597; 438/621
(58) Field of Search .................................... 438/621, 618, 438/597

(56) References Cited

U.S. PATENT DOCUMENTS 5,391,521 * 2/1995 Kim ........................................ 438/621
5,462,886 * 10/1995 Sakai et al. ............................ 427/487
5,571,753 * 11/1996 Saruwatari ............................ 438/621
5,605,862 * 2/1997 Givens et al. ........................ 438/621
5,650,041 * 7/1997 Gotho et al. ...................... 156/651.1

OTHER PUBLICATIONS

S. Wolf, Silicon Processing for the VLSI Era, vol. 2: Process Integration. P127, Jan. 1990.*

Tetsuya Taguwa et al., "Low Contact Resistance Metallization for Gigabit Scale DRAM's Using Fully–Dry Cleaning by Ar/H$_2$ECR Plasma" IEEE Transactions on Electron Devices, vol. 44, No. 4, Apr. 1997, pp. 588–594.

* cited by examiner

Primary Examiner—Matthew Smith
Assistant Examiner—B. V. Keshavan
(74) Attorney, Agent, or Firm—Jones Volentine, L.L.C.

(57) ABSTRACT

A doped polysilicon layer is used to form interconnections in a semiconductor device through contact holes. The doped polysilicon layer reaches through contact holes formed in an interlayer insulation layer to reach a suicide layer formed in exposed portions of respective impurity regions.

8 Claims, 2 Drawing Sheets

SEMICONDUCTOR DEVICE HAVING POLYSILICON INTERCONNECTIONS AND METHOD OF MAKING SAME

BACKGROUND OF THE INVENTION

1. Field of the Invention

The present invention relates to an improved interconnection structure in a semiconductor device. More particularly, the present invention relates to semiconductor devices having doped polysilicon contacts interconnecting impurity regions within the semiconductor device. The doped polysilicon contacts may be simultaneously formed in contact holes by a single polysilicon layer deposition to electrically connect the impurity regions. The present invention also relates to a method of making same.

2. Description of the Related Art

The complexity of integrated circuits continues to increase. The semiconductor industry thus faces new challenges in the successful fabrication of increasingly complex integrated circuits. This increasing complexity takes place in an environment of decreasing integrated circuit size. Accordingly, advances in fabrication technology are required to produce extremely complex, high-density integrated circuits.

Multi-layer metal interconnects have been commonly used to maintain the small size of high-density, integrated circuits. Typically, the metal interconnect layers are separated by an interlayer insulating layer and electrically coupled by metal-filled vias selectively formed through the insulating layer.

FIGS. 1A through 1C are exemplary flow diagrams illustrating a conventional method of forming interconnections in a semiconductor device.

Referring to FIG. 1A, $n^+$-type impurity region 12 and $p^+$-type impurity region 13 are formed in a semiconductor substrate 10. An interlayer insulating layer 14 is formed over the semiconductor substrate 10. Contact holes 16a and 16b are opened in interlayer insulating layer 14 thereby exposing portions of impurity regions 12 and 13.

Referring to FIG. 1B, ohmic contact layers 18a and 18b, of titanium silicide, for example, are formed in the bottom of contact holes 16a and 16b. After forming ohmic contact layers 18a and 18b, a metal layer 20 is deposited in contact holes 16a and 16b, thereby forming ohmic interconnection contacts to $n^+$-type impurity region 12 and to $p^+$-type impurity region 13, as shown in FIG. 1C. Conventionally, metal layer 20 may be formed of a tungsten or titanium nitride layer.

This conventional method of forming interconnections works well enough for larger, less complex semiconductor devices. However, contact holes in higher density semiconductor devices inevitably have increased aspect ratio, i.e., a smaller surface area opening in relation to the depth of the contact hole. Increased aspect ratio makes it difficult to acquire good step coverage in the fabrication process. This is particularly true when a conventional metal layer of tungsten or titanium silicide is used. Further, if heat is applied to the conventional metal layer by a subsequent process step, the metal layer may well lift, that is, be displaced from its desired position.

SUMMARY OF THE INVENTION

The present invention provides improved interconnection contacts, and a method of forming interconnection contacts in a semiconductor device which avoid these problems. Namely, the present invention provides improved step coverage for the layer forming the interconnection contacts, and the lifting phenomenon typically associated with this layer is avoided.

In one aspect the present invention provides a method of forming interconnections in a semiconductor device comprising the steps of; forming an interlayer insulating layer over a semiconductor substrate having first and second impurity regions, and selectively etching the interlayer insulating layer to form contact holes. Thereafter, an ohmic contact layer is formed in portions of the first and second impurity regions exposed by the selective etching process. Finally, a doped polysilicon layer is deposited to fill the contact holes and form the interconnection contacts.

The ohmic contact layer preferably comprises a silicide layer formed by depositing a metal layer over the exposed portions of the first and second impurity regions, and annealing the resulting structure to form a silicide layer by reaction of the deposited metal layer and the semiconductor substrate. The metal layer may consist of titanium, tungsten, or cobalt.

In another aspect the present invention provides a semiconductor device having first and second impurity regions formed in a semiconductor substrate and an interlayer insulating layer formed over the semiconductor substrate. The semiconductor device further comprises contact holes formed through the interlayer insulating layer to expose portions of the first and second impurity regions, and an ohmic contact layer is formed in the exposed portions of the first and second impurity regions. A doped polysilicon layer fills the contact holes and forms the interconnection contacts.

BRIEF DESCRIPTION OF THE DRAWINGS

The present invention may be better understood with its attendant advantages by reference to the following detailed description of the preferred embodiment and the accompanying drawings in which.

DETAILED DESCRIPTION OF THE PREFERRED EMBODIMENT

The preferred embodiment of the present invention will now be described with reference to FIG. 2A through FIG. 2C, which are exemplary flow diagrams showing a method of forming interconnection contacts in a semiconductor device according to an embodiment of the present invention.

Figure 1A:
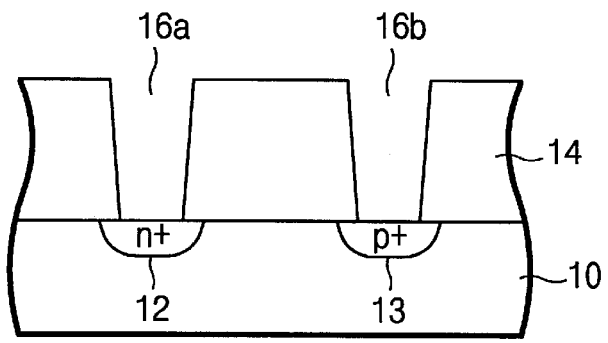
FIG. 1A, FIG. 1B, and FIG. 1C are flow diagrams illustrating an exemplary conventional method of forming interconnection contacts in a semiconductor device.
Figure 1B:
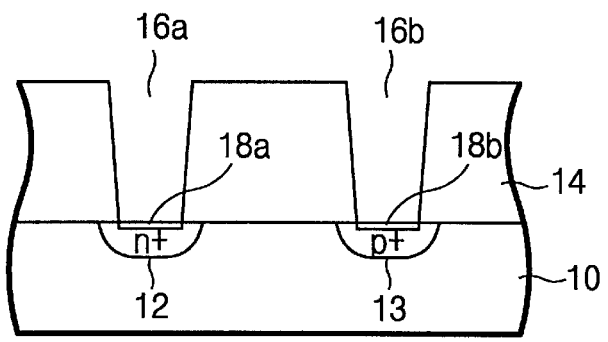
Figure 1C:
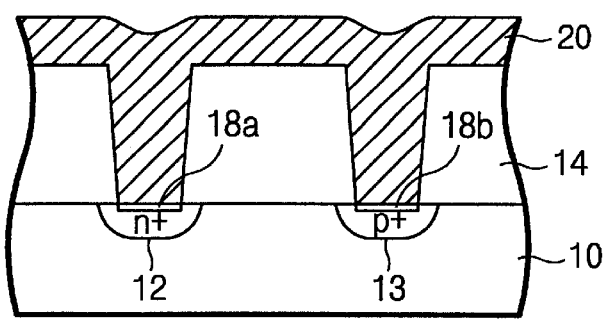
Figure 2A:
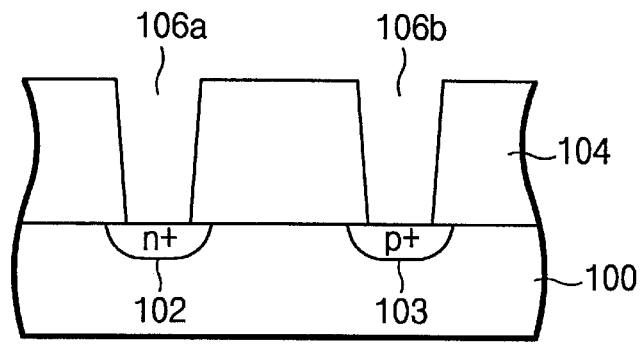
FIG. 2A, FIG. 2B, and FIG. 2C are flow diagrams showing a preferred embodiment of present invention in which interconnection contacts are formed in a semiconductor device.

Referring to FIG. 2A, $n^+$-type impurity region 102 and $p^+$-type impurity region 103 are formed in the semiconductor substrate 100 by n-type and p-type ion implantations, respectively. Herein, only $n^+$-type impurity region 102 and $p^+$-type impurity region 103 are shown, but one of ordinary skill in the art will understand that other components, semiconductor regions, and related structures may well be present in an actual semiconductor device. For example, impurity regions 102 and 103 are shown without an attendant field oxide layer defining the active region, a gate insulating layer on the active region, or a gate electrode on the gate insulating layer. Such additional complexity is not shown so that the present invention may be clearly seen.

Once n+-type impurity region 102 and p+-type impurity region 103 are formed in the semiconductor substrate 100, an interlayer insulating layer 104 is formed over the semiconductor substrate 100 by any suitable, conventional method. Contact holes 106a and 106b are opened in interlayer insulating layer 104, thereby exposing respective portions of impurity regions 102 and 103. After contact holes 106a and 106b are formed, additional ion implantation may be performed to stabilize contact resistance and junction leakage. Diluted hydrofluoric acid may be applied to remove native oxides on the silicon surface.

Figure 2B:
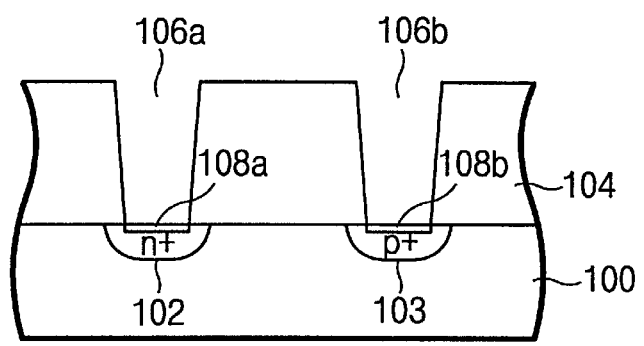
Figure 2C:
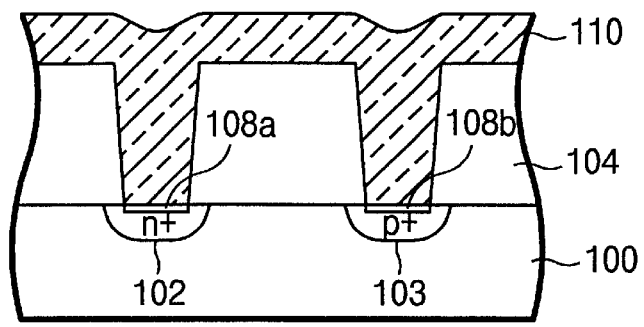

Referring to FIG. 2B, ohmic contact layers 108a and 108b are formed in exposed portions of impurity regions 102 and 103 through contact holes 106a and 106b. The ohmic contact layers 108a and 108b are formed from a silicide layer, such as from a tungsten silicide layer, a titanium silicide layer, or a cobalt silicide layer. A titanium silicide layer is presently preferred. The silicide layer forming ohmic contact layers 108a and 108b may be formed by a conventional silicidation process (not shown), i.e., depositing a metal layer such as titanium to a thickness of about 50 Å to 700 Å over the exposed portions of impurity regions 102 and 103 of semiconductor substrate 100, and then annealing the metal layer to yield a silicide layer created by a reaction between the silicon of semiconductor substrate 100 and the metal layer. The remaining, unreacted metal layer may be removed using a sulfuric acid stripping process.

After forming ohmic contact layers 108a and 108b, doped polysilicon layer 110 having desired filling and thermal resistivity characteristics is deposited over the foregoing structure to fill contact holes 106a and 106b. In this manner, interconnection contacts are simultaneously formed through the contact holes to reach n+-type impurity region 12 and p+-type impurity region 13, as shown in FIG. 2C.

Doped polysilicon layer 110 may comprise either an n+-type polysilicon material or a p+-type polysilicon material having, for example, a dopant concentration of about $10^{21}$ atoms/cm$^3$. In the preferred embodiment, use of a polysilicon material instead of metal as the layer forming the interconnection contacts is possible because the polysilicon layer does not directly contact the impurity regions, but rather contacts the ohmic contact layers formed in the impurity regions.

The polysilicon layer has a good step coverage and excellent filling characteristics as compared to metal. Thus, the present invention avoids the problems associated with conventional metal layer interconnections.

Additional layers (not shown) may be formed over doped polysilicon layer 110. As such, doped polysilicon layer 110 may be used, for example, as lower metal line.

The foregoing preferred embodiment has been given by way of example. One of ordinary skill in the art will understand that various changes in form, composition, and deposition of the various material layers is possible without departing from the scope of the present invention which is defined by the attached claims.

What is claimed is:

1. A method of forming interconnections in a semiconductor device comprising:
    forming an interlayer insulating layer over a semiconductor substrate having n-type and p-type impurity regions;
    selectively etching the interlayer insulating layer to form contact holes through the interlayer insulating layer to expose portions of the n-type and p-type impurity regions;
    forming simultaneously an ohmic contact layer in the portions of the n-type and p-type impurity regions exposed by the contact holes; and
    forming a doped polysilicon layer on the entire surface of the resultant structure where the ohmic contact layer is formed the doped polysilicon layer filling the contact holes.

2. The method of claim 1, wherein the ohmic contact layer comprises a silicide layer.

3. The method of claim 2, wherein said forming of the ohmic contact layer comprises:
    depositing a metal layer on the entire surface of the resultant structure;
    annealing the semiconductor substrate having the metal layer to form a metal silicide layer by reaction of the deposited metal layer and the semiconductor substrate; and
    removing an unreacted metal layer remaining on the interlayer insulating layer.

4. The method of claim 3, wherein the metal layer is one selected from a group consisting of titanium, tungsten, and cobalt.

5. The method of claim 1, wherein said selectively etching the interlayer insulating layer to form contact holes through the interlayer insulating layer to expose portions of the n-type and p-type impurity regions is followed by:
    implanting ions into at least one of the n-type and p-type impurity regions to stabilize contact resistance and junction leakage.

6. The method of claim 1, wherein said selectively etching the interlayer insulating layer to form contact holes through the interlayer insulating layer to expose portions of the n-type and p-type impurity regions is followed by:
    applying diluted hydrofluoric acid to remove native oxide on the exposed n-type and p-type impurity regions.

7. The method of claim 1, wherein the doped polysilicon layer comprises one selected from a group consisting of a n+-type polysilicon material and a p+-type polysilicon material.

8. The method according to claim 1, wherein the doped polysilicon layer has a dopant concentration of about $10^{21}$ atoms/cm$^3$.

* * * * *